(12) United States Patent
Inadome et al.

(10) Patent No.: US 12,543,529 B2
(45) Date of Patent: Feb. 3, 2026

(54) TRANSPORT DEVICE WITH MUTING DEVICE

(71) Applicant: Daifuku Co., Ltd., Osaka (JP)

(72) Inventors: Keita Inadome, Hinocho (JP); Junichi Sakamoto, Hinocho (JP); Tsuyoshi Yoshizaki, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 243 days.

(21) Appl. No.: 18/539,613

(22) Filed: Dec. 14, 2023

(65) Prior Publication Data

US 2024/0203772 A1    Jun. 20, 2024

(30) Foreign Application Priority Data

Dec. 16, 2022    (JP) ................................. 2022-201062

(51) Int. Cl.
*H01L 21/677*    (2006.01)
*H01L 21/67*    (2006.01)

(52) U.S. Cl.
CPC .. *H01L 21/67724* (2013.01); *H01L 21/67265* (2013.01)

(58) Field of Classification Search
CPC ...... B65G 35/00; B65G 49/061; B65G 47/74; B65G 43/02; B65G 43/08; B65G 2201/0297; H01L 21/67265; H01L 21/67724; H01L 21/67259; H01L 21/67706; H01L 21/67727; H01L 21/6773
See application file for complete search history.

(56) References Cited

U.S. PATENT DOCUMENTS

2009/0058642 A1\*  3/2009  Fukumura ................ G01V 8/20
340/556

FOREIGN PATENT DOCUMENTS

JP    2003218679 A  *  7/2003  ............... G01V 8/20
JP    2006317237 A  *  11/2006
JP    200963362 A       3/2009

\* cited by examiner

*Primary Examiner* — Gerald McClain
(74) *Attorney, Agent, or Firm* — The Webb Law Firm (57) ABSTRACT

A transport device includes a transport vehicle, a cover member, an invasion detection sensor, and a muting device configured to invalidate the invasion detection sensor. The transport vehicle includes a mounting section and a wagon section configured to support the mounting section and travel. The detection surface is disposed to intersect with the movement trajectory of the transport target. The muting device invalidates the invasion detection sensor in response to an affirmative detection result from a mount sensor and an affirmative detection result from a range detection sensor, and the muting device validates the invasion detection sensor in response to a negative detection result from the mount sensor or a negative detection result from the range detection sensor.

4 Claims, 4 Drawing Sheets

TRANSPORT DEVICE WITH MUTING DEVICE

CROSS-REFERENCE TO RELATED APPLICATION

This application claims priority to Japanese Patent Application No. 2022-201062 filed Dec. 16, 2022, the disclosure of which is hereby incorporated by reference in its entirety.

BACKGROUND OF THE INVENTION

1. Field of the Invention

The present invention relates to a transport device including a transport vehicle configured to transport a transport target by reciprocating along a predetermined moving path, a cover member covering the moving path, an invasion detection sensor configured to detect an object passing through a detection surface, and a muting device configured to temporarily invalidate the invasion detection sensor.

2. Description of Related Art

An example of such a transport device is disclosed in Japanese Unexamined Patent Application Publication No. 2009-63362 (Patent Literature 1). Hereinafter, in the Description of the Related Art, reference signs in Patent Literature 1 are referred to in parentheses. The transport device in Patent Literature 1 includes an invasion detection sensor (11) and a plurality of mute sensors (A1, A2, B1, B2). The mute sensors (A1, A2) are disposed upstream from the invasion detection sensor (11) in a transport path for a transport target (a workpiece W), and the mute sensors (B1, B2) are disposed downstream from the invasion detection sensor (11). When the transport target is detected by the mute sensors (A1, A2), muting on the invasion detection sensor (11) is started, so that the transport target in the middle of transport is not detected by the invasion detection sensor (11). Further, when the transport target is detected by the mute sensor (B2) disposed on the most downstream side, muting on the invasion detection sensor (11) is ended.

In the meantime, the mute sensor disposed in Patent Literature 1 is an optical sensor including a light projection section and a light receiving section and detects the transport target on the transport path when light emitted from the light projection section is blocked. Accordingly, in a case where the transport target is transparent, for example, the light thus emitted passes through the transport target, so that the mute sensor may not be able to detect the transport target. In such a case, the invasion detection sensor is not muted, so that the transport target may be detected by mistake. That is, depending on the material or the color of the transport target, a problem that the invasion detection sensor cannot be muted appropriately occurs, but Patent Literature 1 does not mention anything about this point.

SUMMARY OF THE INVENTION

In view of the foregoing, it is desired to achieve a transport device that can mute an invasion detection sensor appropriately such that the invasion detection sensor detects an object passing through a detection surface when no transport target passes through the detection surface, and the invasion detection sensor does not detect a transport target when the transport target passes through the detection surface.

A transport device according to this disclosure includes: a transport vehicle configured to transport a transport target by reciprocating along a predetermined moving path; a cover member covering the moving path; an invasion detection sensor configured to detect an object passing through a detection surface; and a muting device configured to temporarily invalidate the invasion detection sensor. The transport vehicle includes a mounting section on which the transport target is placed, and a wagon section configured to support the mounting section and travel. The detection surface is disposed above the mounting section such that the detection surface intersects with a movement trajectory of the transport target placed on the mounting section. When a moving direction is a direction along the moving path, and a detection coverage range is a range of a position of the transport vehicle, in the moving direction, where the transport target placed on the mounting section intersects with the detection surface, the muting device includes a mount sensor configured to detect whether or not the transport target is placed on the mounting section, and a range detection sensor configured to detect whether or not the transport vehicle is within a target range set based on the detection coverage range. The muting device invalidates the invasion detection sensor in response to an affirmative detection result from the mount sensor and an affirmative detection result from the range detection sensor, and the muting device validates the invasion detection sensor in response to a negative detection result from the mount sensor or a negative detection result from the range detection sensor.

In this configuration, when the transport vehicle transports the transport target and the transport vehicle is within the detection coverage range as a range where the transport target placed on the mounting section intersects with the detection surface, the invasion detection sensor is invalidated. This accordingly makes it possible to mute the invasion detection sensor appropriately so that the invasion detection sensor is avoided from detecting the transport target in the middle of transport by mistake.

Further, in the above configuration, when the transport vehicle transports no transport target, the invasion detection sensor is maintained to be validated regardless of the position of the transport vehicle. Since the invasion detection sensor is validated when the transport vehicle does not transport the transport target, it is possible to avoid such a situation that the invasion detection sensor cannot detect an object such as a human body even when the object passes through the detection surface where no transport target is present. This accordingly makes it possible to raise the possibility that an object other than the transport target, passing through the detection surface, can be detected appropriately.

As such, with this configuration, it is possible to mute the invasion detection sensor appropriately such that the invasion detection sensor detects an object passing through the detection surface when no transport target passes through the detection surface, and the invasion detection sensor does not detect the transport target when the transport target passes through the detection surface.

Further features and advantages of the transport device are made clear from the following description on exemplary and nonlimiting embodiments to be described with reference to the drawings.

DESCRIPTION OF THE INVENTION

Figure 1:
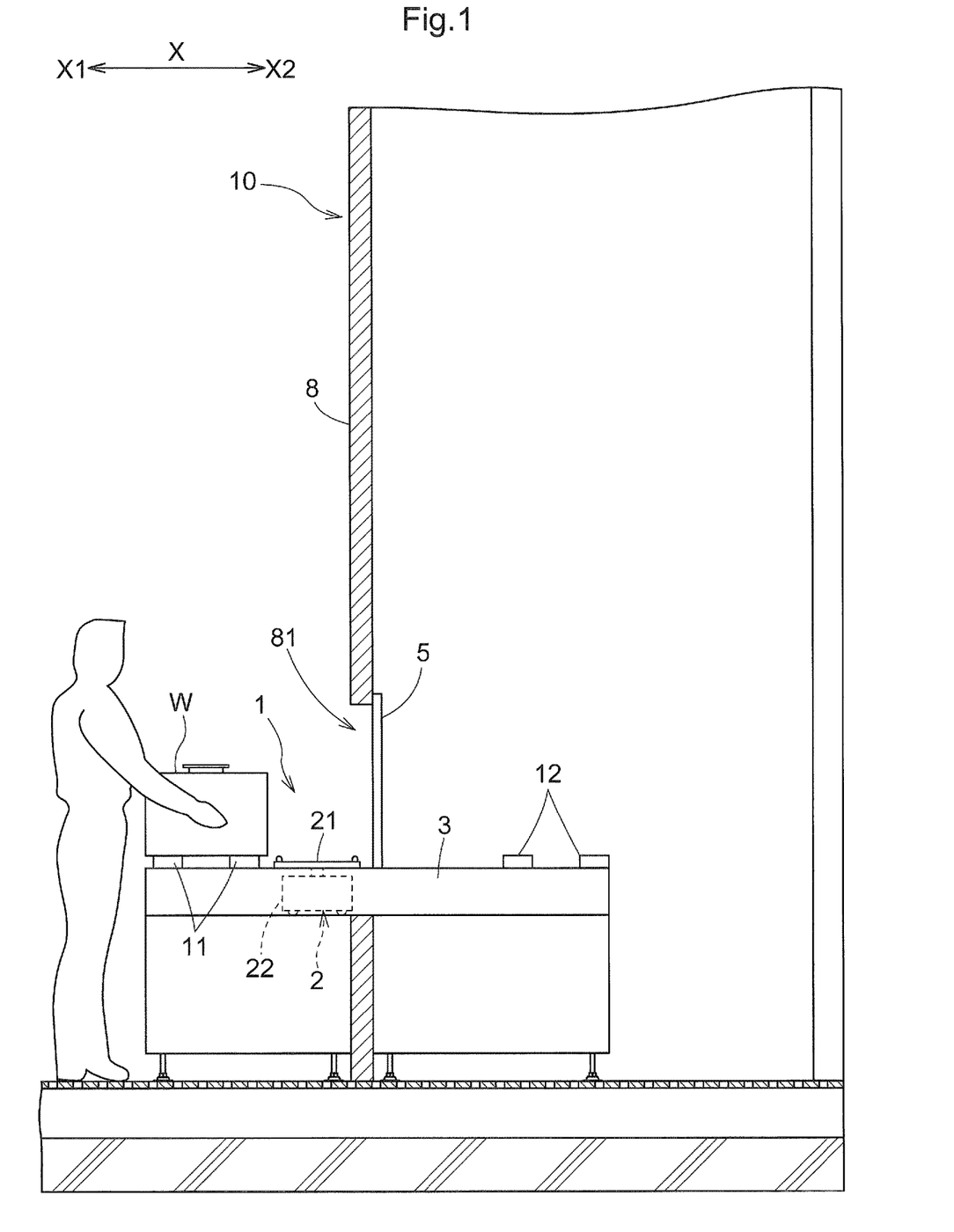
FIG. 1 is a schematic diagram of processing equipment including a transport device.

The following describes an example in which a transport device 1 is applied to processing equipment 10 with reference to drawings. As illustrated in FIG. 1, in the present embodiment, the transport device 1 is provided in the processing equipment 10 and carries a transport target W into and out of the processing equipment 10. In this example, the transport device 1 is provided upward from a floor face on which the processing equipment 10 is disposed, just by the height of the waist of an operator.

In the present embodiment, the transport target W is a container for storing a processing object to be directly processed by the processing equipment 10. The processing equipment 10 performs processing on the processing object stored in the transport target W. More specifically, the transport target W is a FOUP (Front Opening Unified Pod) for storing wafers, and the processing equipment 10 performs processing (for example, rinse, etching, or the like) on the wafers stored in the transport target W.

Figure 2:
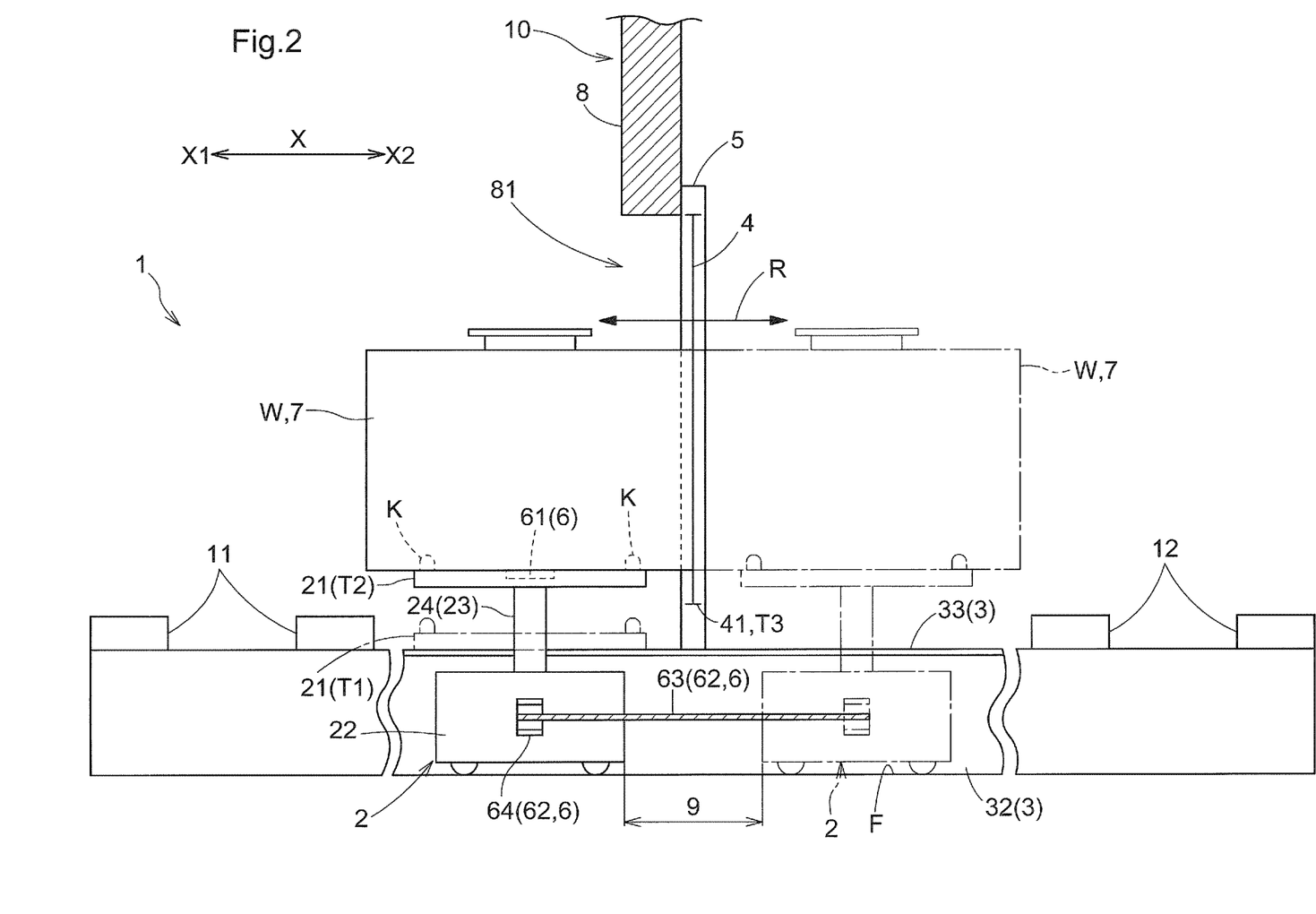
FIG. 2 is a side sectional view of the transport device.
Figure 3:
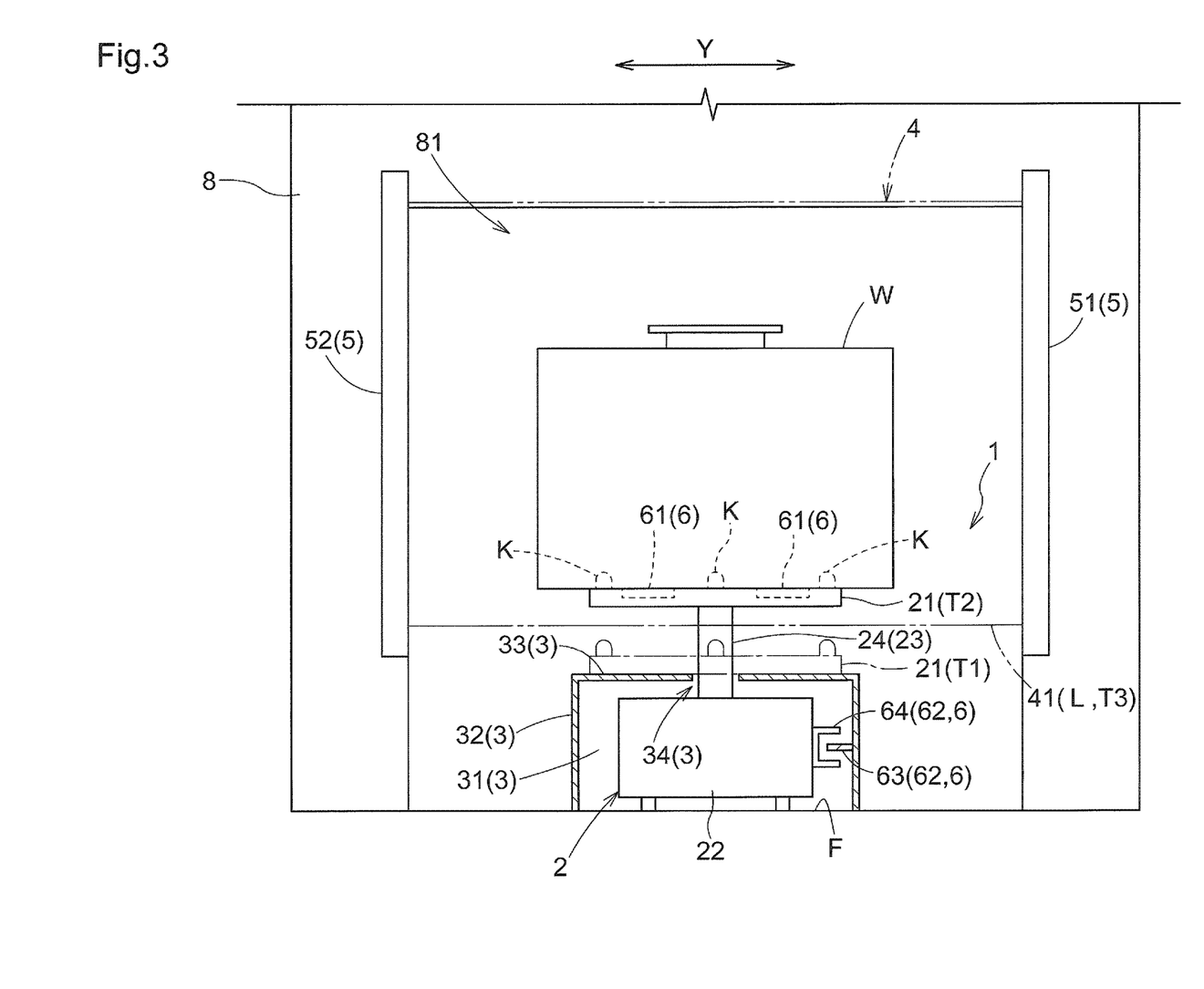
FIG. 3 is a front sectional view of the transport device.

As illustrated in FIGS. 2, 3, the transport device 1 includes a transport vehicle 2 configured to transport the transport target W by reciprocating along a predetermined moving path R, a cover member 3 covering the moving path R, an invasion detection sensor 5 configured to detect an object passing through a detection surface 4, and a muting device 6 configured to temporarily invalidate the invasion detection sensor 5. In the present embodiment, the transport device 1 further includes a control device H. The following describes a concrete configuration of the transport device 1.

Note that, in the following description, a direction along the moving path R is taken as a moving direction X, and a direction perpendicular to the moving direction X in a top-bottom view is taken as a width direction Y. Further, one side in the moving direction X is described as a moving-direction first side X1, and the other side in the moving direction X is described as a moving-direction second side X2.

As illustrated in FIGS. 1, 2, in the present embodiment, the moving path R and the cover member 3 are disposed to penetrate through a wall member 8. Further, the wall member 8 has an opening 81 formed in a part intersecting with a movement trajectory 7 of the transport target W. In this example, the wall member 8 is a wall body (here, an outer wall) covering the inside of the processing equipment 10. The moving path R and the cover member 3 are passed through the opening 81 formed in the wall member 8 and disposed to connect the inside and the outside of the processing equipment 10 to each other. The opening 81 is formed to penetrate through the wall member 8 in the moving direction X such that the transport vehicle 2 and the transport target W transported by the transport vehicle 2 can pass through the opening 81. Further, in the present embodiment, a travel face F on which the transport vehicle 2 can travel along the moving path R is formed. That is, the transport vehicle 2 travels on the travel face F to move along the moving path R. The cover member 3 is disposed to cover a travel trajectory of a wagon section 22 (described later) of the transport vehicle 2 and the travel face F. Hereby, it is possible to prevent a hand or the like of the operator from entering a region where the wagon section 22 moves, for example, thereby making it possible to enhance safety for the transport device 1.

In this example, as illustrated in FIGS. 1, 2, the transport device 1 includes a first support member 11 and a second support member 12. The first support member 11 is provided on the moving-direction first side X1 (that is, outside the processing equipment 10) from the opening 81 of the wall member 8. Further, the second support member 12 is provided on the moving-direction second side X2 (that is, inside the processing equipment 10) from the opening 81 of the wall member 8. The travel face F is disposed to connect the first support member 11 to the second support member 12. That is, the moving path R is a path that connects the first support member 11 to the second support member 12. The first support member 11 and the second support member 12 can support the transport target W and can deliver and receive the transport target W to and from the transport vehicle 2 traveling on the travel face F. The transport vehicle 2 travels on the travel face F to reciprocate on the moving path R such that the transport vehicle 2 delivers and receives the transport target W to and from the first support member 11 and the second support member 12. Note that, in this example, the transport vehicle 2 transports, toward the second support member 12, the transport target W placed on the first support member 11 by the operator from outside the processing equipment 10. The transport target W transported to the second support member 12 is transported from the second support member 12 to a processing section (not illustrated) where rinse or the like is performed on a processing object, for example, by a transport mechanism or the like included in the processing equipment 10. Further, the transport target W subjected to such processing is transported from the processing section to the second support member 12. Then, the transport vehicle 2 transports the transport target W from the second support member 12 toward the first support member 11. The transport target W subjected to the processing and transported to the first support member 11 is collected by the operator. Note that each of the first support member 11 and the second support member 12 is configured such that the transport target W can be placed thereon, and preferably includes a well-known presence sensor configured to detect the transport target W being placed thereon, for example.

In the example of FIGS. 1 and 2, the travel face F is the top surface of a plate-shaped member extending in the moving direction X. The travel face F is disposed such that its position in the up-down direction is below respective top surfaces of the first support member 11 and the second support member 12. Further, the travel face F is disposed such that the start edge (here, an end part on the moving-direction first side X1) of the travel face F overlaps with the first support member 11 in a top-bottom view, and the end edge (here, an end part on the moving-direction second side X2) of the travel face F overlaps with the second support member 12 in a top-bottom view. Note that respective top surfaces of the first support member 11 and the second support member 12 are disposed at the same height.

Further, in the example of FIGS. 1 and 2, the cover member 3 includes a first cover 31, a second cover 32, and a third cover 33, and they are formed as plate-shaped members. The first cover 31 is provided to stand from the start edge of the travel face F and is disposed outwardly from the travel trajectory of the wagon section 22, on the moving-direction first side X1. Two second covers 32 are provided to stand from both ends of the travel face F in the width direction Y and are both disposed outwardly from the travel trajectory of the wagon section 22, in the width direction Y. The third cover 33 is disposed to cover the upper side of the travel trajectory of the wagon section 22 and is provided to be supported from the lower side by the first cover 31 and the two second covers 32. Note that the third cover 33 has a through-hole 34 formed along the moving direction X and penetrating through the third cover 33 in the up-down direction (in other words, a slit-shaped through-hole extending along the moving direction X) such that an aftermentioned lifting and lowering mechanism 23 (here, a lifting and lowering body 24) does not interfere with the third cover 33 when the transport vehicle 2 travels. Thus, the cover member 3 covers the moving path R (here, the travel trajectory of the wagon section 22). More specifically, in the present embodiment, the cover member 3 covering the moving path R partially covers the moving path R such that the through-hole 34 is formed. In the present specification, the word "cover" is used as a concept including both a case where the moving path R is fully covered and a case where the moving path R is partially covered.

As illustrated in FIGS. 2, 3, the transport vehicle 2 includes a mounting section 21 on which the transport target W is placed, and the wagon section 22 configured to support the mounting section 21 and travel. In the present embodiment, the wagon section 22 supports the mounting section 21 from the lower side. The wagon section 22 includes a plurality of wheels configured to roll on the travel face F and a drive motor (not illustrated). When the transport vehicle 2 rotationally drives one or more wheels by the drive motor, the transport vehicle 2 can acquire driving force to cause the wagon section 22 to travel in the moving direction X. Note that, for example, guide rails for guiding one or more wheels in the moving direction X may be provided on the travel face F, or the transport vehicle 2 may include guide wheels different from the wheels separately on side faces or the like of the wagon section 22, for example, and guide rails may be provided to guide the guide wheels in the moving direction X. Further, in this example, the wagon section 22 is connected to a feeder cable (not illustrated) for supplying electric power from a power supply section (not illustrated) provided in the processing equipment 10, but the wagon section 22 may receive electric power by noncontact power supply. In the example illustrated herein, a plurality of (herein, three) positioning pins K for positioning the transport target W is provided on the top surface of the mounting section 21, and hereby, the transport target W transferred from the first support member 11 or the second support member 12 is positioned on the mounting section 21. Thus, the transport vehicle 2 travels while the transport vehicle 2 supports the transport target W on the top surface of the mounting section 21.

In the present embodiment, the transport vehicle 2 further includes the lifting and lowering mechanism 23 configured to lift and lower the mounting section 21 relative to the wagon section 22. As illustrated in FIGS. 2, 3, in a case where the transport target W is not placed on the mounting section 21, the lifting and lowering mechanism 23 positions the mounting section 21 at a first height T1, and in a case where the transport target W is placed on the mounting section 21, the lifting and lowering mechanism 23 positions the mounting section 21 at a second height T2 higher than the first height T1. In this example, the first height T1 is set to a position below the first support member 11 and the second support member 12 but above the cover member 3 (herein, the third cover 33). The second height T2 is set to a position above the first support member 11 and the second support member 12. Further, in this example, the lifting and lowering mechanism 23 includes the lifting and lowering body 24. The lifting and lowering body 24 is configured to be movable in the up-down direction and is provided to connect the mounting section 21 to the wagon section 22. Along with lifting and lowering of the lifting and lowering body 24, the mounting section 21 moves between the first height T1 and the second height T2. Note that the lifting and lowering mechanism 23 can include a cylinder (for example, an air cylinder, an electric cylinder, or the like) for reciprocating the lifting and lowering body 24 in the up-down direction, a rectilinear guide mechanism for guiding the lifting and lowering body 24 in the up-down direction, or the like.

In the example of FIG. 2, when the transport vehicle 2 positions the mounting section 21 at the first height T1, the transport vehicle 2 can move together with the mounting section 21 to right under the first support member 11 and the second support member 12. Further, each of the first support member 11 and the second support member 12 is configured not to interfere with the lifting and lowering body 24 and the mounting section 21 moving in the up-down direction. Accordingly, in a case where the transport vehicle 2 receives the transport target W placed on the first support member 11 or the second support member 12, the transport vehicle 2 lifts the mounting section 21 from the first height T1 to the second height T2 while the transport vehicle 2 is right under the first support member 11 or the second support member 12, so that the transport vehicle 2 can transfer the transport target W onto the mounting section 21. In a case where the transport vehicle 2 transfers the transport target W onto the first support member 11 or the second support member 12 from the mounting section 21, the transport vehicle 2 should perform the procedure reversely to the above.

As illustrated in FIGS. 2, 3, in the present embodiment, the invasion detection sensor 5 is disposed such that the detection surface 4 is formed in the opening 81. In this example, the invasion detection sensor 5 includes a projector 51 and an optical receiver 52. The projector 51 includes a plurality of light projection sections for emitting light. The optical receiver 52 includes a plurality of light receiving sections for receiving light emitted from each of the plurality of light projection sections. In this example, the invasion detection sensor 5 is provided on the wall member 8. In the example of FIG. 3, the projector 51 and the optical receiver 52 are formed to extend in the up-down direction. The projector 51 and the optical receiver 52 of the invasion detection sensor 5 are disposed to be distanced from each other in the width direction Y across the opening 81. When the projector 51 emits a plurality of beams of light aligned in the up-down direction toward the optical receiver 52, the detection surface 4 (that is, a light curtain) is formed. In the following description, the position of a bottom end 41 of the detection surface 4 in the up-down direction is taken as a third height T3.

As illustrated in FIGS. 2, 3, the detection surface 4 is disposed above the mounting section 21 such that the detection surface 4 intersects with the movement trajectory 7 of the transport target W placed on the mounting section 21. In the present embodiment, the bottom end 41 of the detection surface 4 is disposed above the mounting section 21 at the first height T1 but below the mounting section 21 at the second height T2. That is, like the present embodiment, in a case where the mounting section 21 of the transport vehicle 2 is lifted and lowered, when the first height T1 is regarded as the height of the mounting section 21 on which no transport target W is placed, the third height T3 is at a position higher than the first height T1 but lower than the second height T2. Hereby, in a case where the transport vehicle 2 transports no transport target W, it is possible to avoid the invasion detection sensor 5 from detecting the mounting section 21. Further, for example, in a case where the transport vehicle 2 does not include the lifting and lowering mechanism 23, and the mounting section 21 is not lifted and lowered, the mounting section 21 is always disposed at the first height T1 regardless of whether or not the transport target W is placed thereon, and the third height T3 is at a position higher than the first height T1. Further, in the present embodiment, the detection surface 4 is disposed to cover the whole area above a detection boundary line L set above the mounting section 21 in the opening 81. The detection boundary line L is a virtual line defining the bottom end 41 of the detection surface 4. In this example, the detection surface 4 is disposed to cover the whole area in the up-down direction and the whole area in the width direction Y in a part above the detection boundary line L in the opening 81. In a case where the mounting section 21 is lifted and lowered like the present embodiment, the detection boundary line L is set above the mounting section 21 disposed at the first height T1. In this example, the detection boundary line L is set above the mounting section 21 at the first height T1 but below the mounting section 21 at the second height T2 and is more specifically set at the third height T3. Note that objects to be detected by the invasion detection sensor 5 when the objects intersect with the detection surface 4 are, for example, foreign matters untargeted for transport by the transport device 1, e.g., a part (an arm, a head, or the like) of a human body. However, the transport target W itself is also detectable by the invasion detection sensor 5, and therefore, the transport target W is also included as one of such objects. Accordingly, when the invasion detection sensor 5 works during transport of the transport target W, the transport target W thus transported is detected as an invasion object. In view of this, in a case where the transport target W is to be transported, it is necessary to mute the invasion detection sensor 5 so that the invasion detection sensor 5 does not work. Although not specifically described herein, in a case where the invasion detection sensor 5 detects an object, the control device H (described later) stops the operations of the transport device 1 and the processing equipment 10, for example, or the control device H alerts the operator by producing a warning sound or the like.

The following description describes a concrete configuration of the muting device 6. Note that the range of the position of the transport vehicle 2, in the moving direction X, where the transport target W placed on the mounting section 21 intersects with the detection surface 4 is described as a detection coverage range 9. In the present embodiment, as illustrated in FIG. 2, the detection coverage range 9 is from a position of the wagon section 22 where an end part, on the moving-direction second side X2, of the transport target W placed on the mounting section 21 overlaps with the detection surface 4 to a position of the wagon section 22 where an end part, on the moving-direction first side X1, of the transport target W placed on the mounting section 21 overlaps with the detection surface 4. That is, when at least part of the wagon section 22 enters the detection coverage range 9, the transport target W on the mounting section 21 intersects with the detection surface 4. By setting the detection coverage range 9 as such, the detection coverage range 9 can be made extremely short. Hereby, a period during which the invasion detection sensor 5 is muted can be minimized during transport of the transport target W. Note that, in a case where the detection coverage range 9 is set, both ends, in the moving direction X, of the transport target W placed on the mounting section 21 may not necessarily precisely overlap with the detection surface 4 in the moving direction X, and the detection coverage range 9 may be set such that they deviate from the detection surface 4 only by a given length in the moving direction X.

As illustrated in FIGS. 2, 3, the muting device 6 includes a mount sensor 61 configured to detect whether or not the transport target W is placed on the mounting section 21, and a range detection sensor 62 configured to detect whether or not the transport vehicle 2 is within a target range set based on the detection coverage range 9. The target range is set, for example, to the same range as the detection coverage range 9 or to a range obtained by expanding either side or both sides, in the moving direction X, of the detection coverage range 9 only by a given amount. The given amount is set to a value smaller than the magnitude of the detection coverage range 9. In the present embodiment, the muting device 6 includes a muting control unit 65, a wired or wireless communications device (not illustrated) configured to connect the muting control unit 65 to the mount sensor 61 and the range detection sensor 62 provided in the transport vehicle 2, and a wired or wireless communications device (not illustrated) configured to connect the muting control unit 65 to the invasion detection sensor 5. In this example, the muting control unit 65 is provided in the control device H (described later). Accordingly, the muting control unit 65 enables the mount sensor 61 and the range detection sensor 62 to communicate with the invasion detection sensor 5 via the control device H. Further, in this example, the mount sensor 61 and an in-vehicle sensor 64 (described alter) provided in the range detection sensor 62 are provided in the transport vehicle 2. The transport vehicle 2 is communicable with the control device H by wired communication (via a communication cable). Hereby, the muting control unit 65 can acquire detection information detected by the mount sensor 61 or detection information detected by the in-vehicle sensor 64, via the control device H. Note that it is preferable that the communication cable described above be stored in cable bear (registered trademark) or the like with a feeder cable connecting the transport vehicle 2 to a feeder section (not illustrated). Note that the transport vehicle 2 and the control device H may communicate with each other wirelessly.

As illustrated in FIGS. 2 and 3, the mount sensor 61 is provided in the mounting section 21. In this example, a plurality of (here, two) mount sensors 61 is provided in the mounting section 21, and each mount sensor 61 detects the transport target W, so that the transport vehicle 2 recognizes that the transport target W is placed on the mounting section 21. In the example of FIGS. 2 and 3, the mount sensor 61 is a reflection-type optical sensor including a light projection section and a light receiving section provided integrally, and the mount sensor 61 detects the transport target W such that light emitted upward is blocked and reflected. However, the mount sensor 61 may be constituted by a well-known sensor such as a limit switch, other than the optical sensor.

In the present embodiment, the range detection sensor 62 includes a detection body 63 disposed along the moving path R and the in-vehicle sensor 64 provided in the transport vehicle 2 and configured to detect the detection body 63. Further, the detection body 63 is provided such that the in-vehicle sensor 64 detects the detection body 63 when the transport vehicle 2 is within the target range set based on the detection coverage range 9, but the in-vehicle sensor 64 does not detects the detection body 63 when the transport vehicle 2 is outside the target range. More specifically, the in-vehicle sensor 64 is provided in the wagon section 22 (here, on the side face of the wagon section 22) of the transport vehicle 2. In a case where the target range is set to the same range as the detection coverage range 9, when at least part of the wagon section 22 enters the detection coverage range 9 and the transport target W intersects with the detection surface 4, the in-vehicle sensor 64 detects the detection body 63, but when the wagon section 22 completely leaves from the detection coverage range 9 and the transport target W does not intersect with the detection surface 4, the detection body 63 is placed along the moving path R such that the in-vehicle sensor 64 does not detect the detection body 63. In this case, the range detection sensor 62 detects at least part of the wagon section 22 being within the detection coverage range 9. However, for example, a range set to be wider than the detection coverage range 9 only by a given amount may be set as the target range such that the range detection sensor 62 detects at least part of the wagon section 22 being within the target range. Note that, as the range detection sensor 62, a laser range finder can be provided in an end part on one side, in the moving direction X, of the moving path R or in the wagon section 22, or an encoder can be provided in a wheel of the wagon section 22. Further, in the example of FIG. 2, the in-vehicle sensor 64 is provided on a side face on one side, in the width direction Y, of the wagon section 22, and in response to this, the detection body 63 is provided on the one side in the width direction Y to face the wagon section 22. However, the in-vehicle sensors 64 may be provided on side faces on both sides, in the width direction Y, of the wagon section 22, and in response to this, the detection bodies 63 may be provided on both sides in the width direction Y to face the wagon sections 22.

Figure 5:
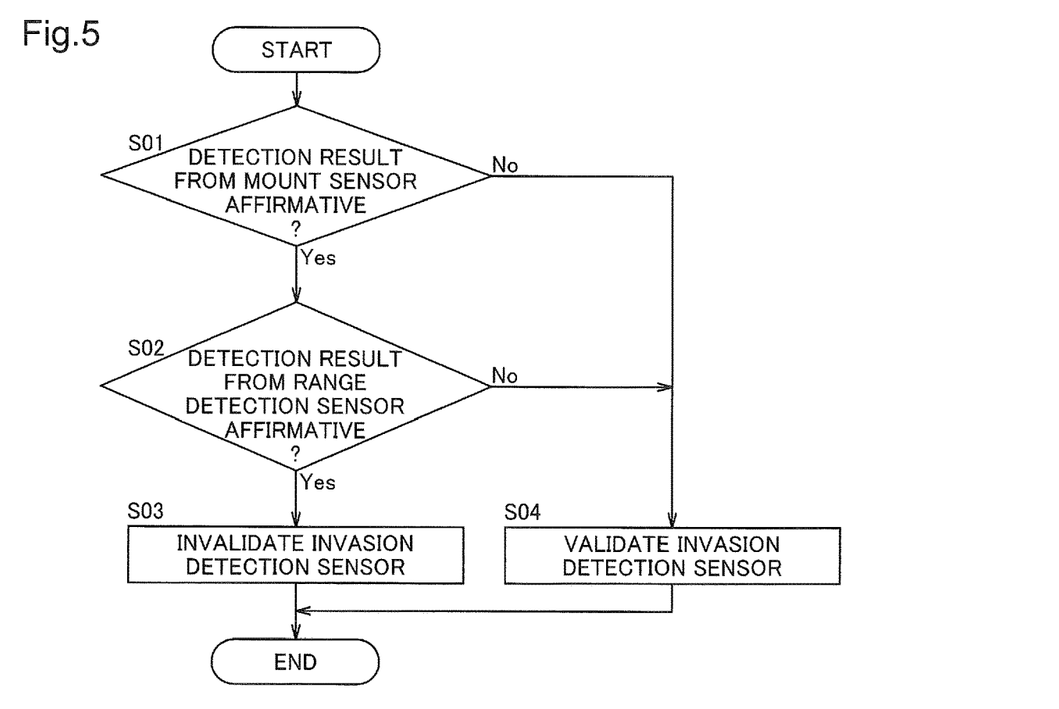
FIG. 5 is a control flow diagram.

As illustrated in FIG. 5, the muting device 6 invalidates the invasion detection sensor 5 in response to an affirmative detection result from the mount sensor 61 and an affirmative detection result from the range detection sensor 62. In the present embodiment, when the mount sensor 61 detects the transport target W placed on the mounting section 21 and the in-vehicle sensor 64 determines that the detection body 63 is detected, the muting control unit 65 invalidates the invasion detection sensor 5. In this example, when the muting control unit 65 determines to invalidate the invasion detection sensor 5, the control device H interrupts supply of electric power to the invasion detection sensor 5 so that the detection surface 4 is not formed by the projector 51 and the optical receiver 52. Note that the invasion detection sensor 5 may be invalidated by discarding the detection result from the invasion detection sensor 5 while the detection surface 4 is formed by the projector 51 and the optical receiver 52. Further, the muting device 6 validates the invasion detection sensor 5 in response to a negative detection result from the mount sensor 61 or a negative detection result from the range detection sensor 62. In the present embodiment, when the mount sensor 61 detects no transport target W, or when the in-vehicle sensor 64 detects no detection body 63, the muting control unit 65 validates the invasion detection sensor 5. While the invasion detection sensor 5 is invalidated by muting, when the muting control unit 65 determines to validate the invasion detection sensor 5, the control device H cancels the muting of the invasion detection sensor 5. That is, the control device H restarts supply of electric power to the invasion detection sensor 5 so that the detection surface 4 is formed by the projector 51 and the optical receiver 52.

Figure 4:
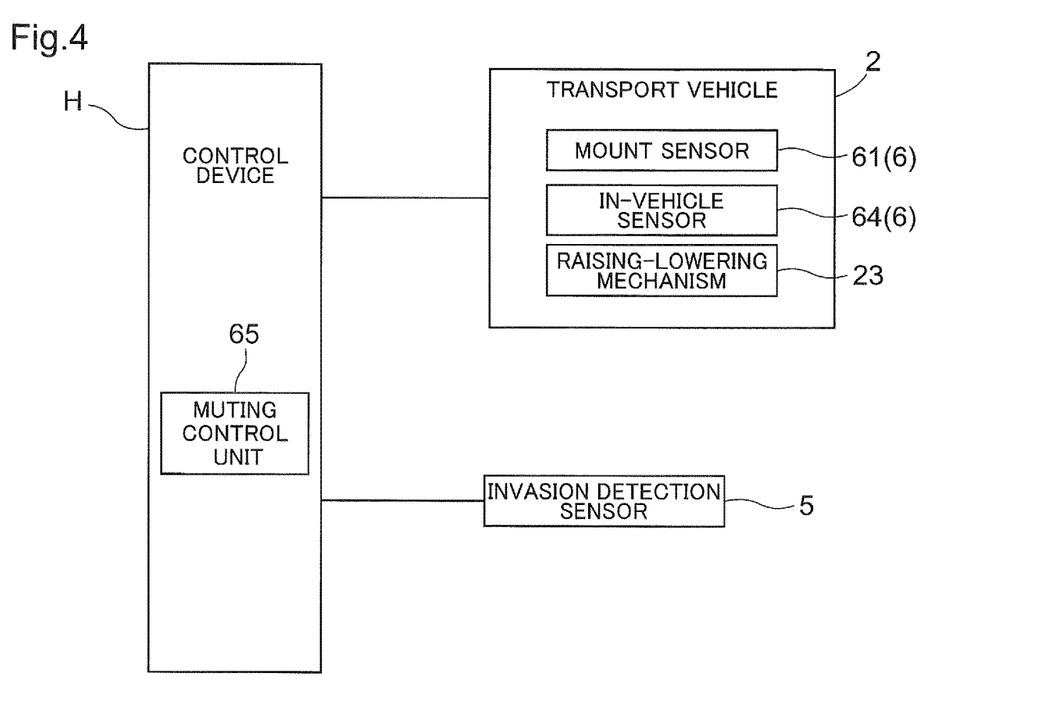
FIG. 4 is a control block diagram.

The control device H controls the transport vehicle 2, the invasion detection sensor 5, and the muting device 6 as illustrated in FIG. 4. Further, the control device H includes the muting control unit 65 as described above. In this example, the control device H is provided in the processing equipment 10. The control device H includes an arithmetic processing unit such as a CPU, and a peripheral circuit such as a memory, and various functions of the control device H are implemented in collaboration with those pieces of hardware and programs executed on hardware such as the arithmetic processing unit. The control device H may be constituted by a set of multiple pieces of hardware (pieces of discrete hardware) communicable with each other, instead of a single piece of hardware.

In the present embodiment, the control device H controls the transport vehicle 2 and causes the transport vehicle 2 to transport the transport target W. More specifically, when the transport target W is placed on the first support member 11, the control device H causes the transport vehicle 2 to move toward the first support member 11. The control device H controls the lifting and lowering mechanism 23 such that the lifting and lowering mechanism 23 moves the mounting section 21 from the first height T1 to the second height T2 to place the transport target W onto the mounting section 21. After that, the control device H causes the transport vehicle 2 to move toward the second support member 12. The control device H controls the lifting and lowering mechanism 23 such that the lifting and lowering mechanism 23 moves the mounting section 21 from the second height T2 to the first height T1 to place the transport target W onto the second support member 12.

Further, when the transport target W subjected to processing is placed on the second support member 12, the control device H causes the transport vehicle 2 to move toward the second support member 12. The control device H controls the lifting and lowering mechanism 23 such that the lifting and lowering mechanism 23 moves the mounting section 21 from the first height T1 to the second height T2 to place the transport target W onto the mounting section 21. After that, the control device H causes the transport vehicle 2 to move toward the first support member 11. The control device H controls the lifting and lowering mechanism 23 such that the lifting and lowering mechanism 23 moves the mounting section 21 from the second height T2 to the first height T1 to place the transport target W onto the first support member 11.

Next will be described a control related to muting on the invasion detection sensor 5, with reference to the control flow illustrated in FIG. 5. Note that, in the present embodiment, the muting control unit 65 determines whether or not muting is validated for the invasion detection sensor 5, as described above.

In the present embodiment, when the muting control unit 65 determines that a detection result from the mount sensor 61 is affirmative (S01: Yes), the muting control unit 65 determines whether or not a detection result from the range detection sensor 62 is affirmative (S02). When the muting control unit 65 determines that the detection result from the range detection sensor 62 is affirmative (S02: Yes), the muting control unit 65 invalidates the invasion detection sensor 5 (S03). Further, when the muting control unit 65 determines that the detection result from the range detection sensor 62 is negative (S02: No), the muting control unit 65 validates the invasion detection sensor 5 (S04). Further, when the muting control unit 65 determines that the detection result from the mount sensor 61 is negative (S01: No), the muting control unit 65 also validates the invasion detection sensor 5 (S04). Note that, differently from the example illustrated in FIG. 5, the process of step S02 may be performed before the process of step S01, or the process of step S01 and the process of step S02 may be performed at the same time.

Thus, in a case where the transport vehicle 2 transports the transport target W and the transport vehicle 2 is within the detection coverage range 9, the invasion detection sensor 5 is invalidated. Hereby, regardless of the material or the color of the transport target W, it is possible to avoid the invasion detection sensor 5 from detecting the transport target W in the middle of transport by mistake. Further, when the transport vehicle 2 transports no transport target W, the invasion detection sensor 5 is maintained to be validated regardless of the position of the transport vehicle 2. Since the invasion detection sensor 5 is validated when the transport vehicle 2 transports no transport target W, it is possible to avoid such a situation that the invasion detection sensor 5 cannot detect an object such as a human body even when the object passes through the detection surface 4 where no transport target W is present. Further, even in a case where the transport vehicle 2 transports the transport target W, when the transport vehicle 2 is out of the detection coverage range 9, the invasion detection sensor 5 is validated. This accordingly makes it possible to set, to a minimum period, a period during which the invasion detection sensor 5 is invalidated.

Other Embodiments (1) The above embodiment deals with the configuration in which the transport device 1 is applied to the processing equipment 10, as an example, but the present invention is not limited to this. For example, the transport device 1 can be applied to an article storage facility or the like for storing the transport target W, for example.

(2) The above embodiment deals with the configuration in which the range detection sensor 62 detects the detection body 63 when the transport vehicle 2 is within a target range set based on the detection coverage range 9, as an example, but the present invention is not limited to this. For example, the range detection sensor 62 may detect the detection body 63 when the transport vehicle 2 is outside the target range. In this case, when the range detection sensor 62 does not detect the detection body 63, the range detection sensor 62 determines that the transport vehicle 2 is within the target range. That is, when the range detection sensor 62 does not detect the detection body 63, the detection result from the range detection sensor 62 is affirmative. In this case, even in a case where the range detection sensor 62 malfunctions and cannot detect the detection body 63, while the transport target W is placed on the mounting section 21, the invasion detection sensor 5 is always muted, so that the transport vehicle 2 can continue transporting the transport target W.

(3) The above embodiment deals with the configuration in which the range detection sensor 62 includes the detection body 63 disposed along the moving path R and the in-vehicle sensor 64 provided in the transport vehicle 2 and configured to detect the detection body 63, as an example, but the present invention is not limited to this. For example, one or more sensors may be provided along the moving path R as the range detection sensor 62, and the transport vehicle 2 may include the detection body 63 to be detected by the sensors.

(4) The above embodiment deals with the configuration in which, in a case where the transport vehicle 2 includes the lifting and lowering mechanism 23 configured to lift and lower the mounting section 21 relative to the wagon section 22, the bottom end 41 of the detection surface 4 is disposed above the mounting section 21 at the first height T1 but below the mounting section 21 at the second height T2, as an example. However, the present invention is not limited to this. For example, the bottom end 41 of the detection surface 4 can be set above the second height T2.

(5) The above embodiment deals with the configuration in which the detection surface 4 is disposed to cover the whole area above the detection boundary line L in the opening 81, as an example, but the present invention is not limited to this. In this case, the detection surface 4 may not necessarily be disposed to cover the whole area above the detection boundary line L in the opening 81. For example, the detection surface 4 may be disposed to cover only a given area where an object other than the transport target W might be present when the object enters the opening 81.

(6) Note that the configurations disclosed in the above embodiment can be applied in combination with the configurations disclosed in other embodiments (including combinations of the embodiments described in Other Embodiments) as long as no inconsistency occurs. In terms of other configurations, the embodiments disclosed in the present specification are also just examples in all respects. Accordingly, various modifications can be made appropriately as far as it does not deviate from the scope of this disclosure.

Outline of Embodiment

The following describes the outline of the transport device described above.

A transport device according to this disclosure includes: a transport vehicle configured to transport a transport target by reciprocating along a predetermined moving path; a cover member covering the moving path; an invasion detection sensor configured to detect an object passing through a detection surface; and a muting device configured to temporarily invalidate the invasion detection sensor. The transport vehicle includes a mounting section on which the transport target is placed, and a wagon section configured to support the mounting section and travel. The detection surface is disposed above the mounting section such that the detection surface intersects with a movement trajectory of the transport target placed on the mounting section. When a moving direction is a direction along the moving path, and a detection coverage range is a range of a position of the transport vehicle, in the moving direction, where the transport target placed on the mounting section intersects with the detection surface, the muting device includes a mount sensor configured to detect whether or not the transport target is placed on the mounting section, and a range detection sensor configured to detect whether or not the transport vehicle is within a target range set based on the detection coverage range. The muting device invalidates the invasion detection sensor in response to an affirmative detection result from the mount sensor and an affirmative detection result from the range detection sensor, and the muting device validates the invasion detection sensor in response to a negative detection result from the mount sensor or a negative detection result from the range detection sensor.

In this configuration, when the transport vehicle transports the transport target and the transport vehicle is within the detection coverage range as a range where the transport target placed on the mounting section intersects with the detection surface, the invasion detection sensor is invalidated. This accordingly makes it possible to mute the invasion detection sensor appropriately so that the invasion detection sensor is avoided from detecting the transport target in the middle of transport by mistake.

Further, in the above configuration, when the transport vehicle transports no transport target, the invasion detection sensor is maintained to be validated regardless of the position of the transport vehicle. Since the invasion detection sensor is validated when the transport vehicle transports no transport target, it is possible to avoid such a situation that the invasion detection sensor cannot detect an object such as a human body even when the object passes through the detection surface where no transport target is present. This accordingly makes it possible to raise the possibility that an object other than the transport target, passing through the detection surface, can be detected appropriately.

As such, with this configuration, it is possible to mute the invasion detection sensor appropriately such that the invasion detection sensor detects an object passing through the detection surface when no transport target passes through the detection surface, and the invasion detection sensor does not detect the transport target when the transport target passes through the detection surface.

Here, it is preferable that: the range detection sensor include a detection body disposed along the moving path and an in-vehicle sensor provided in the transport vehicle and configured to detect the detection body; and the detection body be detected by the in-vehicle sensor when the transport vehicle is within the target range but not detected by the in-vehicle sensor when the transport vehicle is outside the target range.

With this configuration, it is possible to appropriately detect, with a relatively simple configuration, whether or not the transport vehicle is within the target range based on the detection coverage range.

Further, in this configuration, the in-vehicle sensor provided in the transport vehicle detects the detection body disposed along the moving path, instead of detecting the transport target, thereby making it possible to avoid a detection result from changing depending on the type or the state of the transport target. Accordingly, it is possible to stably mute the invasion detection sensor.

Further, it is preferable that: the transport vehicle further include a lifting and lowering mechanism configured to lift and lower the mounting section relative to the wagon section; the lifting and lowering mechanism be configured to position the mounting section at a first height when no transport target is placed on the mounting section and to position the mounting section at a second height higher than the first height when the transport target is placed on the mounting section; and the detection surface have a bottom end disposed above the mounting section at the first height but below the mounting section at the second height.

With this configuration, it is possible to avoid the invasion detection sensor from detecting the mounting section when the transport vehicle transports no transport target, and it is possible to decease a gap between the mounting section and the bottom end of the detection surface, thereby making it possible to reduce the possibility that an object such as a human body passes through the gap.

Further, it is preferable that: the moving path and the cover member be disposed to penetrate through a wall member; the wall member have an opening formed in a part intersecting with the movement trajectory of the transport target; and the detection surface be disposed to cover, in the opening, a whole area above a detection boundary line set above the mounting section.

With this configuration, it is possible to prevent the object such as a human body from entering the detection surface of the invasion detection sensor from outside. Accordingly, even in a case where a dangerous device or the like is disposed ahead of the detection surface, for example, safety for the operator is easily secured.

The transport device according to this disclosure should yield at least one of the above effects.

What is claimed is:

1. A transport device comprising:
a transport vehicle configured to transport a transport target by reciprocating along a predetermined moving path;
a cover member covering the moving path;
an invasion detection sensor configured to detect an object passing through a detection surface; and
a muting device configured to temporarily invalidate the invasion detection sensor, and
wherein:
the transport vehicle comprises a mounting section on which the transport target is configured to be placed, and a wagon section configured to support the mounting section and travel;
the detection surface is disposed above the mounting section on which the transport target is configured not to be placed such that the detection surface intersects with a movement trajectory of the transport target placed on the mounting section;
when a moving direction is a direction along the moving path, and a detection coverage range is a range of a position of the transport vehicle, in the moving direction, where the transport target placed on the mounting section intersects with the detection surface, the muting device includes a mount sensor configured to detect whether or not the transport target is placed on the mounting section, and a range detection sensor configured to detect whether or not the transport vehicle is within a target range set based on the detection coverage range;
the muting device invalidates the invasion detection sensor in response to an affirmative detection result from the mount sensor and an affirmative detection result from the range detection sensor; and
the muting device validates the invasion detection sensor in response to a negative detection result from the mount sensor or a negative detection result from the range detection sensor.

2. The transport device according to claim 1, wherein:
the range detection sensor comprises a detection body disposed along the moving path and an in-vehicle sensor provided in the transport vehicle and configured to detect the detection body; and
the detection body is detected by the in-vehicle sensor when the transport vehicle is within the target range but is not detected by the in-vehicle sensor when the transport vehicle is outside the target range.

3. The transport device according to claim 1, wherein:
the transport vehicle further comprises a lifting and lowering mechanism configured to lift and lower the mounting section relative to the wagon section;
the lifting and lowering mechanism is configured to position the mounting section at a first height when no transport target is placed on the mounting section and to position the mounting section at a second height higher than the first height when the transport target is placed on the mounting section; and
the detection surface has a bottom end disposed above the mounting section at the first height but below the mounting section at the second height.

4. The transport device according to claim 1, wherein:
the moving path and the cover member are disposed to penetrate through a wall member;
the wall member has an opening formed in a part intersecting with the movement trajectory of the transport target; and
the detection surface is disposed to cover, in the opening, a whole area above a detection boundary line set above the mounting section.

* * * * *